(12) United States Patent
West et al.

(10) Patent No.: US 9,735,469 B1
(45) Date of Patent: Aug. 15, 2017

(54) INTEGRATED TIME DELAY UNIT SYSTEM AND METHOD FOR A FEED MANIFOLD

(71) Applicants: James B. West, Cedar Rapids, IA (US); Michael L. Hageman, Mount Vernon, IA (US); Russell D. Wyse, Center Point, IA (US)

(72) Inventors: James B. West, Cedar Rapids, IA (US); Michael L. Hageman, Mount Vernon, IA (US); Russell D. Wyse, Center Point, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 455 days.

(21) Appl. No.: 14/300,055

(22) Filed: Jun. 9, 2014

(51) Int. Cl.
   *H01Q 3/26* (2006.01)
   *H01L 23/00* (2006.01)
   *H01P 1/185* (2006.01)

(52) U.S. Cl.
   CPC .......... *H01Q 3/2682* (2013.01); *H01L 24/24* (2013.01); *H01P 1/185* (2013.01)

(58) Field of Classification Search
   CPC ........ H01Q 3/2682; H01P 1/185; H01L 24/24
   USPC ........................................................ 342/375
   See application file for complete search history.

(56) References Cited

U.S. PATENT DOCUMENTS

| | | | |
|---|---|---|---|
| 4,870,374 A | 9/1989 | Harris | |
| 5,013,979 A | 5/1991 | Birleson | |
| 5,414,433 A * | 5/1995 | Chang | H01Q 3/2682 342/372 |
| 5,592,179 A | 1/1997 | Windyka | |
| 5,721,556 A * | 2/1998 | Goutzoulis | H01Q 3/2676 342/374 |
| 5,873,026 A | 2/1999 | Reames | |
| 6,133,868 A | 10/2000 | Butler et al. | |
| 6,191,735 B1 * | 2/2001 | Schineller | H01P 1/185 333/164 |
| 6,989,788 B2 * | 1/2006 | Marion | H01P 1/185 333/164 |
| 7,808,798 B2 * | 10/2010 | Cotte | H01L 23/66 361/760 |
| 8,466,846 B1 | 6/2013 | Elsallal et al. | |
| 8,659,499 B1 | 2/2014 | Pluymers | |
| 9,083,350 B1 | 7/2015 | Posner et al. | |

(Continued)

FOREIGN PATENT DOCUMENTS

WO    WO-2007/023371 A1    3/2007

OTHER PUBLICATIONS

Carchon et al. "Thin Film Technologies for Millimeter-Wave Passives and Antenna Integration" imec EuMW 2008 38th European Microwave Conference. pp. 1-46.*

(Continued)

*Primary Examiner* — Gregory C Issing
(74) *Attorney, Agent, or Firm* — Donna P. Suchy; Daniel M. Barbieri (57) ABSTRACT

A system and method provides time delays for an antenna array such as an electronically-scanned antenna array in a wide band range. The system and method can utilize time delay units including a radio frequency integrated circuit time delay unit portion provided on a radio frequency integrated circuit and an interposer time delay unit portion. The interposer time delay portion is provided on an interposer associated with the radio frequency integrated circuit.

20 Claims, 5 Drawing Sheets

(56) References Cited

U.S. PATENT DOCUMENTS

| | | |
|---|---|---|
| 2002/0093453 A1 | 7/2002 | Vail et al. |
| 2005/0270219 A1 | 12/2005 | Dwelly et al. |
| 2005/0275585 A1 | 12/2005 | Shima et al. |
| 2006/0068707 A1 | 3/2006 | Greeley |
| 2009/0231197 A1 | 9/2009 | Richards |
| 2009/0251368 A1 | 10/2009 | McCune, Jr. |
| 2010/0117917 A1 | 5/2010 | Kindt et al. |
| 2010/0259446 A1 | 10/2010 | Corman et al. |
| 2011/0109507 A1 | 5/2011 | Warnick |
| 2011/0299456 A1 | 12/2011 | Schmidt et al. |
| 2011/0305258 A1 | 12/2011 | Boutchich et al. |
| 2012/0277590 A1* | 11/2012 | Song .................. G10K 11/346 600/443 |
| 2012/0326781 A1 | 12/2012 | Mori et al. |
| 2013/0235962 A1 | 9/2013 | O'Keefe et al. |

OTHER PUBLICATIONS

U.S. Appl. No. 14/300,074, filed Jun. 9, 2014, West et al.
U.S. Appl. No. 14/788,360, filed Jun. 30, 2015, Hageman et al.
Non-Final Office Action on U.S. Appl. No. 14/300,074, mail date Apr. 22, 2016, 20 pages.
Non-Final Office Action on U.S. Appl. No. 14/849,491, mail date May 24, 2016, 11 pages.
U.S. Appl. No. 13/714,209, filed Dec. 13, 2012, Wyse et al.
U.S. Appl. No. 13/737,777, filed Jan. 9, 2013, Wyse et al.
U.S. Appl. No. 13/760,964, filed Feb. 6, 2013, Finley et al.
U.S. Appl. No. 13/781,449, filed Feb. 28, 2013, West et al.
U.S. Appl. No. 13/837,934, filed Mar. 15, 2013, West et al.
U.S. Appl. No. 14/300,021, filed Jun. 9, 2014, West et al.
U.S. Appl. No. 14/300,055, filed Jun. 9, 2014, West et al.
Kraus, J.D. et al., Antennas for All Applications, Third Edition, McGraw-Hill Higher Education, p. 109, 2002.
Molisch, A.F. et al., Time Hopping and Frequency Hopping in Ultrawideband Systems, IEEE Pacific Rim Conference on Communications, Computers and Signal Processing, p. 541-544, 2003.
Non-Final Office Action on U.S. Appl. No. 14/300,021, dated Mar. 21, 2017, 19 pages.
Non-Final Office Action on U.S. Appl. No. 14/788,360, dated Feb. 24, 2017, 26 pages.

\* cited by examiner

INTEGRATED TIME DELAY UNIT SYSTEM AND METHOD FOR A FEED MANIFOLD

CROSS-REFERENCE TO RELATED PATENT APPLICATIONS

This application is related to U.S. application Ser. No. 14/300,074, filed on an even data herewith by West et al., and entitled "Active Manifold System and Method for an Array Antenna," and U.S. application Ser. No. 14/300,021, filed on an even date herewith by West el., and entitled "Synchronously Tuned Phase Shifter System and Method for an Array Antenna", both assigned to the Assignee of the present application and hereby incorporated by reference in their entireties.

BACKGROUND

The present disclosure relates generally to the field of antenna systems. More specifically, the present disclosure relates generally to the field of time delay units for feed manifolds including but not limited to, feed manifolds for phased array antenna systems or electronically scanned array (ESA) antenna systems, such as active electronically scanned array (AESA) antenna systems.

Antenna arrays are utilized with transceivers. As used in this application, the term transceiver refers to an electronic device embodied as a transmitter, a receiver or a transmitter/receiver. The antenna array can be steered by using variable phase shifters coupled to respective antenna elements in the antenna array to direct the antenna at a pointing angle. The phase shifters can be variable phase shifters which provide a set of phase delays in response to a set of commands to direct the antenna to appropriate pointing angles without physically moving the antenna elements.

In certain applications, transceivers using phase shifters can be susceptible to beam squint. The beam squint can be caused by phase shifters which do not have a constant response with respect to frequency. For example, conventional phase shifters generally have a phase delay which changes with changes in frequency ($\tau=-\delta\Phi/\delta f$). The change in phase shift or phase delay due to frequency can adversely affect the accuracy of the pointing angle of the antenna. For example, the pointing angle can change by more than 90 degrees across a frequency range between 2.0 and 18.0 Gigahertz (GHz) due to the small consistent operational band width of the phase shifters. In ultra wide band (UWB) applications, problems caused by the response of the variable phase shifter to frequency are more pronounced. Accordingly, a severe pulse distortion/dispersion can result from the use of a UWB AESA with phase shifters. In addition, operating active electronic scanning arrays with phase shifters in the UWB can result in pattern/gain corruption, wave form modulation distortion, loss of range/link margin, loss of directionality and loss of data rate due to the small consistent operational bandwidth of the variable phase shifter.

Time delay units (TDUs) can be used instead of phase shifters to direct the antenna to a pointing angle without significant beam squint issues. However, time delay units are physically large in size. The large size of the time delay unit with respect to the aperture lattice spacing fails to prevent the creation of false main beams. Further, conventional time delay units can require prohibitively excessive direct current (DC) power. In digital implementations, conventional time delay units can introduce quantization errors. The quantization errors can result in high side lobe levels for an active electronically scanned array.

Thus, there is a need for an antenna system which is not as susceptible to beam squint and/or grating lobes. Further, there is a need for a time delay unit with analog like behavior. Further still, there is a need for a time delay unit for an antenna system with at least one of: reduced size, reduced power consumption, and reduced quantization errors. Further still, there is a need for a reduced size feed manifold that does not include large time delay paths. Further still, there is a need for active time delay units which are smaller, lighter, and require less power. Yet further still, there is a need for a method of providing an active radio frequency integrated circuit-based manifold with time delay units. There is a further need for a miniature N-way feed manifold with integrated time delay units. There is a further need to integrate time delay units on a radio frequency integrated circuit (RFIC) for one dimensional or two dimensional AESA beam scanning.

It would be desirable to provide a system and/or method that provides one or more of these or other advantageous features. Other features and advantages will be made apparent from the present specification. The teachings disclosed extend to those embodiments that fall within the scope of the appended claims, regardless of whether they accomplish one or more of the aforementioned needs.

SUMMARY

An exemplary embodiment relates to an electronically steerable antenna system. The electronically steerable antenna system includes antenna elements and time delay units. Each of the time delay units is associated with a respective antenna element of the antenna elements. The time delay units include a radio frequency integrated circuit time delay unit portion and an interposer time delay unit portion. The interposer time delay portion is provided on an interposer associated with a radio frequency integrated circuit. The radio frequency integrated circuit time delay unit portion has time paths disposed on the radio frequency integrated circuit.

Another exemplary embodiment relates to a method of steering using an electronically scanned antenna array. The method includes using a first time delay unit at least partially disposed on a radio frequency integrated circuit associated with a first antenna element and using a second time delay unit at least partially disposed on a radio frequency integrated circuit associated with a second antenna element. The first time delay unit includes a number of selectable first time delay paths to provide a first time delay for the first antenna element. The second time delay unit includes a number of selectable second time delay paths to provide a second time delay for the second antenna element.

Another exemplary embodiment relates to a time delay unit for an ultra-wide band antenna array. The time delay unit includes a radio frequency integrated circuit time delay unit portion comprising a number of first selectable delay paths on a radio frequency integrated circuit, and an interposer time delay unit portion including a number of second selectable delay paths. The interposer time delay portion is provided on an interposer associated with the radio frequency integrated circuit.

BRIEF DESCRIPTION OF THE DRAWINGS

The invention will become more fully understood from the following detailed description, taken in conjunction with the accompanying drawings, wherein like reference numerals refer to like elements, in which.

DETAILED DESCRIPTION

Before describing in detail the particular improved system and method, it should be observed that the invention includes, but is not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

Referring generally to the figures, a feed manifold for an antenna array is shown and described that may be used in radar, sensor and communications systems according to certain embodiments. The feed manifold can be used with electronically steerable antenna arrays and non-electronically steerable antenna arrays. For example, the systems and methods described can be utilized in communication, sensing and/or radar systems, such as, military radar systems or weather radar systems, electronic intelligence (ELINT) receivers, electronic counter measure (ECM) systems, electronic support measure (ESM) systems, targeting systems or other systems. In one embodiment, the systems and methods are utilized to provide an ultra-wide band (UWB) system. The steerable antenna arrays can include but are not limited to phased-array antenna systems, electronically scanned array antenna systems, or electronically scanned array (ESA) antenna systems, such as active electronically-scanned array antenna systems.

Figure 1:
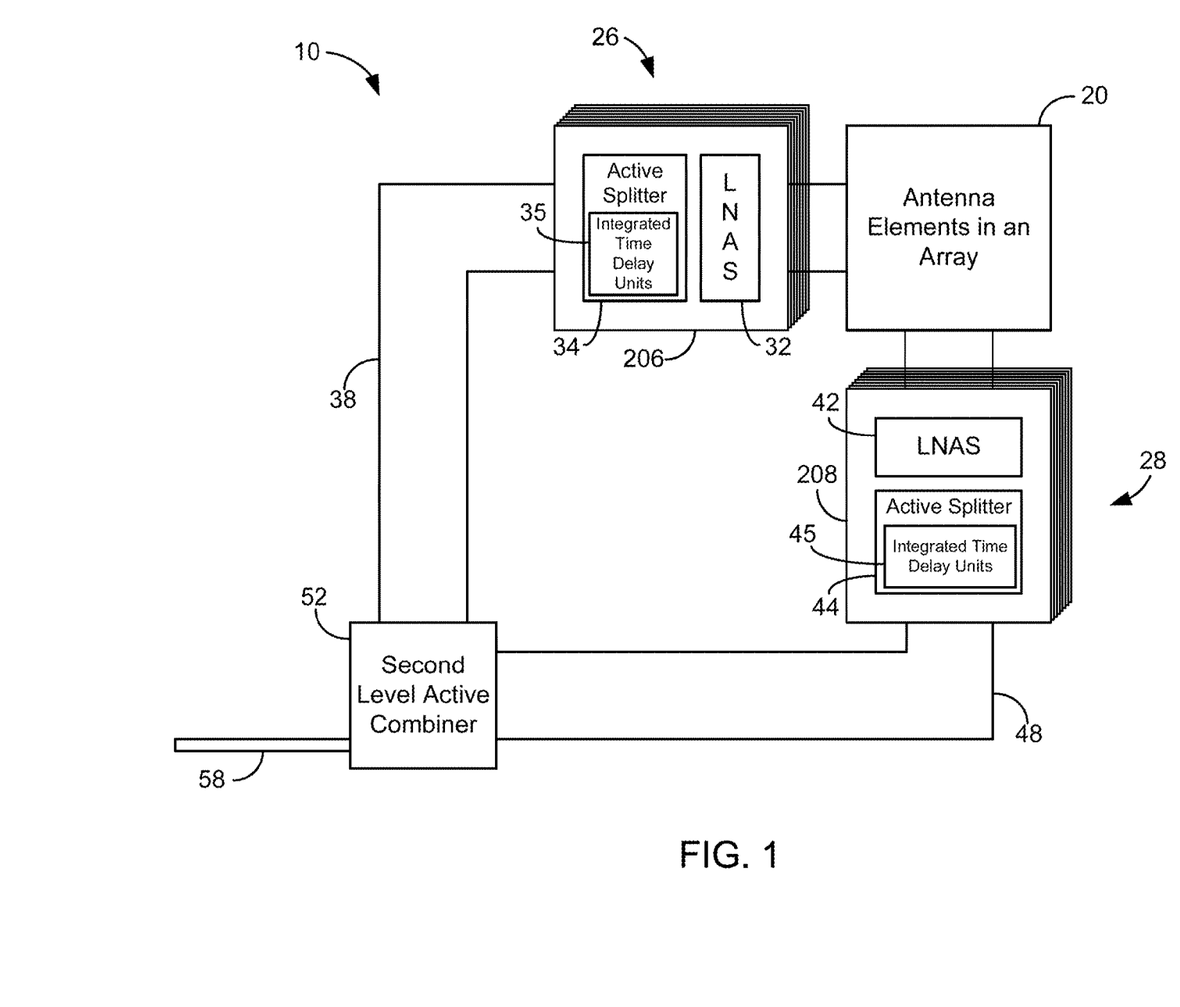
FIG. 1 is a general block diagram of a feed manifold including a time delay unit and an antenna array in accordance with an exemplary embodiment.

With reference to FIG. 1, a feed manifold system 10 includes an array of antenna elements 20, a set 28 of row cards 208, a set 26 of column cards 206, and a second level splitter/combiner system 52. Feed manifold system 10 provides an interface to a transceiver. Feed manifold system 10 provides paths for signals provided to each of antenna elements 20 from the transceiver and/or from each of antenna elements 20 to the transceiver. Feed manifold system 10 provides appropriate combining, splitting, amplification, phase adjustment, and time delays for the signals associated with antenna elements 20. In one embodiment, one or more of the combining, splitting, amplification, phase adjustment, and time delay operations is performed utilizing active combiners/splitters associated with a radio frequency integrated circuit (RFIC). Feed manifold system 10 can simultaneously operate at more than one channel (e.g., a four channel system) in one embodiment. Although a BAVA egg crate PCB architecture is described herein and in the patent applications incorporated herein by reference, the time delay circuits or units described herein can be used in any system architecture including but not limited to multi-layer planar printed circuit board architectures. In one embodiment, the multilayer printed circuit board architecture includes a radiation layer disposed toward the top of a printed circuit board layer stack. In another embodiment, the multilayer printed circuit board architecture can include radiating elements, a feed interconnect, time delay units, etc. disposed on a common multi-layer printed circuit board resembling a personal computer motherboard configuration.

Feed manifold system 10 can be part of a sensing system, radar system, and communication system in one embodiment. In one embodiment, system 10 can be part of an electronic intelligence (ELINT) receiver, an electronic countermeasure (ECM) system, an electronic support measure (ESM) system, and/or hybrids thereof. Feed manifold system 10 can be realized using parallel radio frequency integrated circuit sub-circuits within the radio frequency integrated circuit in one embodiment.

Array of antenna elements 20 can be arranged as a one dimensional or two dimensional array of various sizes. Array of antenna elements 20 can be a M×N array, where M and N are integers and where M represents the number of row and N represents the number of columns in one embodiment. In one embodiment, M and N can be any combination of the following integers: 4, 8, 16, 32, 64, 128 and 256. In other embodiments, M and N can be different numbers (e.g., 0, 1, 2, 12, 24, etc.) without departing from the scope of the invention.

Antenna elements 20 can be any type of radiating element or dipole for receiving or transmitting radio frequency signals. In one embodiment, antenna elements 20 are conductive components or printed circuit board patterned elements. Antenna elements 20 can be patterned (or otherwise configured) and can be positioned for a particular polarization. For example, antenna elements 20 associated with set 26 of cards 206 can be configured for vertical polarization, and antenna elements 20 associated with set 28 of cards 208 can be configured for horizontal polarization. In one embodiment, antenna elements 20 can be configured for circular polarization, elliptical polarization, etc. In one embodiment, antenna elements 20 are Balanced Antipodal Vivaldi Array (BAVA) antenna elements.

Array of antenna elements 20 can be embodied as a Balanced Antipodal Vivaldi Array aperture, or other antenna system in certain embodiments. In one embodiment, antenna elements 20 are embodied as a dual polarization array, such as, the array shown in U.S. Pat. No. 8,466,846. U.S. Pat. No. 8,466,846 is incorporated herein by reference in its entirety.

Cards 206 are printed circuit board cards housing at least one radio frequency integrated circuit. The radio frequency integrated circuit can be a silicon germanium, gallium arsenide, indium phosphate, or a complementary metal oxide semiconductor integrated circuit configured for radio frequency operation. Various active circuits can be provided on the integrated circuit including but not limited to: power amplifiers, low noise amplifiers, variable power amplifiers, transmit/receive switches, temperature sensing equipment, radio frequency (RF) power and phase delay sensing components, time delay units, digital control, interfaces, etc. in one embodiment. In one embodiment, cards 206 include active splitters/combiners 34 and low noise amplifiers 32. Active splitter/combiners 34 include integrated time delay units 35 in one embodiment. The term splitter/combiner as used herein refers to a splitter/combiner, a combiner or a combination splitter and combiner.

Cards 206 can include antenna elements 20 in one embodiment. Cards 206 are configured to connect with separate antenna elements 20 in rows of the array in another embodiment. Each of amplifiers 32 is coupled to each antenna element 20 in the row corresponding to each card 206 in one embodiment. Amplifiers 32 are integrated on the radio frequency integrated circuit on each card 206 in one embodiment.

Active splitters/combiners 34 use radio frequency transistor devices for effecting combining/splitting operations in one embodiment. Active splitting/combiners 34 are coupled to amplifiers 32 and communicate four channel signals for each card 206 at conductors 38 in one embodiment. Card 206 can be configured along with antenna element 20 to provide four channels of vertical polarization signals in one embodiment. The vertical polarization signals for each card 206 are communicated with second level combiner system 52 via conductors 38 in one embodiment. Various numbers of channels can be utilized without departing from the scope of the invention.

Active splitters/combiners 34 are integrated on the radio frequency integrated circuit on each card 206. Active splitters/combiners 34 can include one or more of fixed amplifiers, variable gain amplifiers, and/or time delay units 35 for signals on paths associated with active splitters and combiners in one embodiment. The fixed amplifiers, variable gain amplifiers, and/or time delay units 35 are integrated with the active splitters/combiners 34 on the radio frequency integrated circuit in one embodiment.

Cards 208 are similar to cards 206 in one embodiment. Cards 208 are printed circuit board cards housing at least one radio frequency integrated circuit in one embodiment. The radio frequency integrated circuit can be a silicon germanium, gallium arsenide, indium phosphate, or a complementary metal oxide semiconductor integrated circuit configured for radio frequency operation. Various active circuitry can be provided on the integrated circuit including but not limited to: power amplifiers, low noise amplifiers, variable power amplifiers, transmit/receive switches, temperature sensing equipment, radio frequency (RF) power and phase delay sensing components, time delay units 45, digital control, interfaces, etc. in one embodiment. In one embodiment, cards 208 include active splitters/combiners 44 and low noise amplifiers 42. Active splitters/combiners 44 can include integrated time delay units 45.

Cards 208 include antenna elements 20 in one embodiment. Cards 208 are configured to connect with separate antenna elements 20 in columns of the array in one embodiment. Each of amplifiers 42 is coupled to each antenna element 20 in the column corresponding to card 208 in one embodiment. Amplifiers 42 are integrated on the radio frequency integrated circuit on each card 208 in one embodiment. In one embodiment, amplifiers 32 and 42 are on a receive path.

Active splitters/combiners 44 are similar to active splitters/combiners 34 and are coupled to amplifiers 42 and communicate four channel signals for each card 208 at conductors 48 in one embodiment. Cards 208 can be configured along with antenna element 20 to provide four channels of horizontal polarization signals in one embodiment. The horizontal polarization signals for each card 208 are provided to second level combiner system 52 via conductors 48 in one embodiment.

Active splitters/combiners 44 are integrated on the radio frequency integrated circuit on each card 208. Active splitters/combiners 44 can include one or more of fixed amplifiers, variable gain amplifiers, and/or time delay units 45 for signals on paths associated with active splitters and combiners in one embodiment. The fixed amplifiers, variable gain amplifiers, and/or time delay units are integrated with the active splitters/combiners 44 on the radio frequency integrated circuit in one embodiment.

Second level splitter/combiner system 52 includes one or more printed circuit board cards housing at least on radio frequency integrated circuit in one embodiment. System 52 includes active combiners/splitters similar to active splitters/combiners 34 and 44. Second level splitter/combiner system 52 provides signals to the transceiver at conductors 58 and receives signals from the transceiver at conductors 58 in one embodiment. Second level splitter/combiner system 52 provides signals to antenna elements 20 through cards 206 and 208 at conductors 38 and 48 and receives signals from antenna elements 20 through cards 206 and 208 at conductors 38 and 48 in one embodiment. In one embodiment, second level splitter/combiner system 52 provides or receives each type polarization signal for each channel at conductors 58 (e.g., in a four channel system four vertical polarization signals and four horizontal polarization signals in one embodiment). In one embodiment, second level splitter/combiner system 52 does not include passive splitters/combiners.

In one embodiment, set 28 of cards 208 includes M number of cards 208 and set 26 of cards 206 includes N number cards 206 corresponding to the M×N array of antenna elements 20 in one embodiment. Although shown with set 26 of cards 206 and set 28 of cards 208, feed manifold system 10 can be provided with only one of set 26 or set 28 for single polarization operations or a single card 206 or 208 for one dimensional operation. For example, a single set 26 of cards 206 or a single set of cards 208 arranged in one row or one column can be used with a one dimensional array of antenna elements 20. In one embodiment, set 26 of cards 206 is used to form a columnar beam former. Feed manifold system 10 can be provided with a single card 206, a single card 208, a single set 26 of cards 206 or a single set 28 of cards 208 without departing from the scope of the invention. Cards 206 and 208 can be arranged as described in U.S. application Ser. No. 14/300,074, entitled "Active Manifold System and Method for an Array Antenna".

In one embodiment, feed manifold system 10 can employ multi-chip modules discussed in U.S. application Ser. No. 13/760,964 filed Feb. 6, 2013, Ser. No. 13/781,449, filed Feb. 28, 2013, and Ser. No. 13/837,934 filed Mar. 15, 2013, all of which are incorporated herein by reference in their entireties. In one embodiment, feed manifold system 10 can include components described in U.S. application Ser. No. 13/714,209 filed Dec. 13, 2012 and Ser. No. 13/737,777 filed Jan. 9, 2013, both incorporated herein by reference in their entireties. Although described as bi-directionally communicating (e.g., transmit/receive) across manifold system 10, manifold system 10 can be a unidirectional system (e.g., transmit only or receive only) without departing from the scope of the claims.

Figure 2:
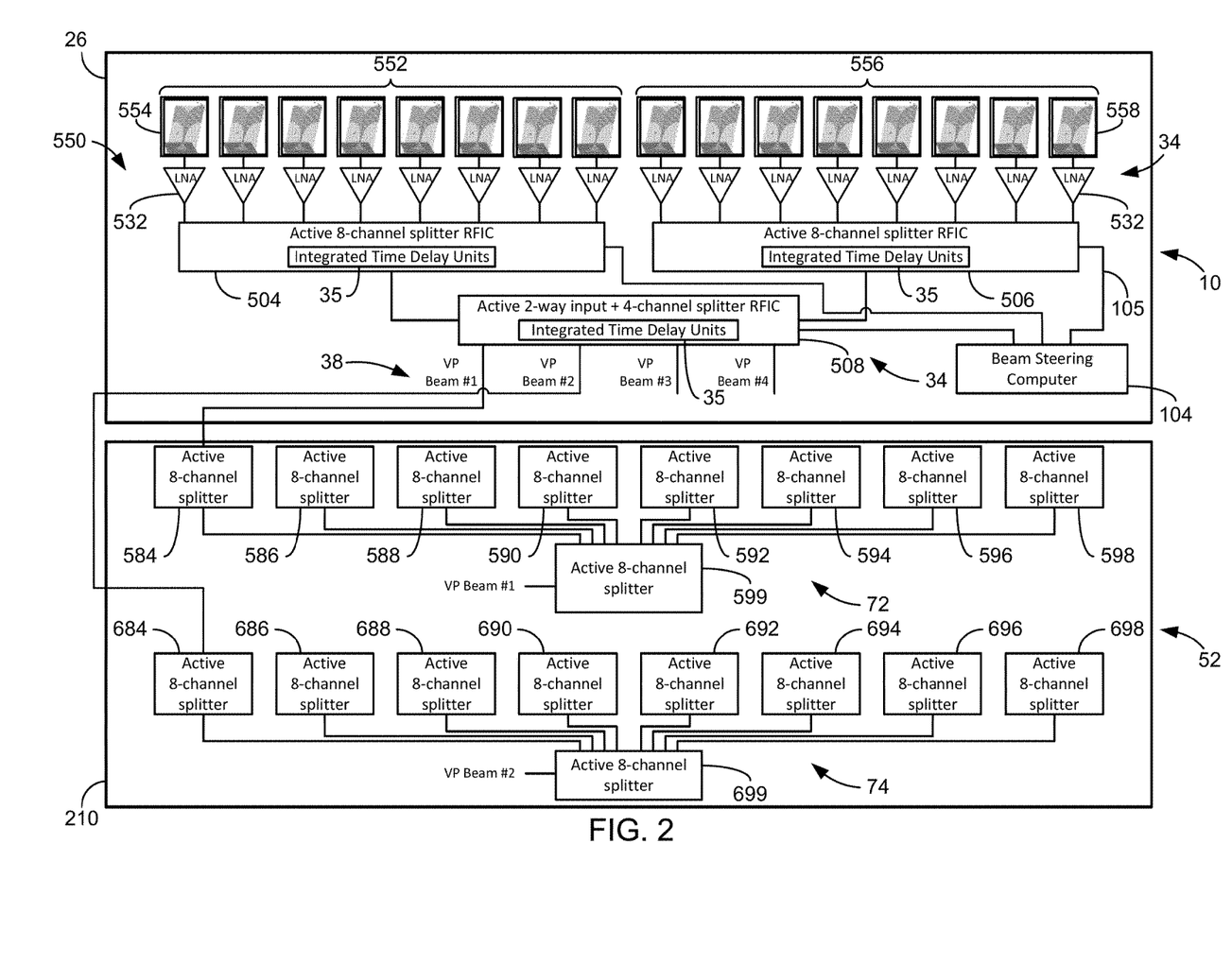
FIG. 2 is a more detailed block diagram of a portion of the feed manifold illustrated in FIG. 1 in accordance with an exemplary embodiment.

With reference to FIG. 2, a portion of manifold system 10 is shown. The portion includes card 206 and a portion 210 of second level splitter combiner system 52. Active splitters/combiners 34 of card 206 include a splitter/combiner 504 with one or more integrated time delay units 35, a splitter/combiner 506 with one or more integrated time delay units 35 and a splitter/combiner 508 with one or more integrated time delay units 35. Portion 210 of second level splitter combiner system 52 includes a set 72 of splitters/combiners 584, 586, 588, 590, 592, 594, 596, and 598 and a set 74 of splitters/combiners 684, 686, 688, 690, 692, 694, 696 and 698 (each including integrated time delay units) in one embodiment. In one embodiment, splitter combiner 599 is coupled to set 72 and splitter combiner 699 is coupled to set 74. Additional sets similar to sets 72 and 74 can also be provided for receiving and providing other channel signals from and to splitter/combiner 508 and enabling beam forming in one embodiment. Splitter/combiner 599 and 699 can also include an integrated time delay unit in one embodiment.

Splitter/combiner 504 receives signals from and provides signals to a set 552 of eight antenna elements 554 in one embodiment. Antenna elements 554 correspond to antenna elements 20 (FIG. 1) and can be integrated with card 206 or separate from card 206. Splitter/combiner 506 receives signals from and provides signals to a set 556 of eight antenna elements 558 in one embodiment. Antenna elements 558 correspond to antenna elements 20 (FIG. 1) and can be integrated with card 206 or separate from card 206.

A set 550 of low noise amplifiers 532 (e.g., corresponding to amplifiers 32 in FIG. 1) can be provided between splitters/combiners 504 and 506 and respective elements 554 and 558 in one embodiment. Splitters/combiners 504 and 506 can each be an active eight-channel splitter/combiner in one embodiment. Splitters/combiners 504 and 506 can each include one or more sets of fixed amplifiers, a variable gain amplifiers, and/or time delay units 35 coupled to respective amplifiers 532 in one embodiment.

Splitter/combiners 504 and 506 are coupled to splitter/combiner 508 which provides channel signals at conductors 38. Splitter/combiner 508 can be an active two way input plus four channel splitter in one embodiment. Splitters/combiner 508 can include one or more of a fixed amplifier, a variable gain amplifier, and/or time delay unit 35 in one embodiment. Splitter/combiners 504, 506, and 508 can be integrated on the same radio frequency integrated circuit on card 206 in one embodiment.

Splitters/combiners 584, 586, 588, 590, 592, 594, 596, 598, 599, 684, 686, 688, 690, 692, 694, 696, 698 and 699 are active splitters/combiners. Splitters/combiners 584, 586, 588, 590, 592, 594, 596, 598, 599, 684, 686, 688, 690, 692, 694, 696, 698 and 699 can be 8 channel splitters/combiners.

Other cards in set 26 can be coupled to second splitter/combiner system 52 in a similar manner. Cards 208 in FIG. 1 can be similarly coupled to second level combiner/splitter system 52 as described with respect to card 206 in FIG. 2. The number of channels and splitters/combiners described in FIG. 2 are not shown or described in a limiting fashion. Any number of channels and splitters/combiners can be utilized depending upon system criteria and performance requirements. In one embodiment, a multilayer motherboard configuration can be utilized as opposed to a nested card arrangement. Splitters/combiners 584, 586, 588, 590, 592, 594, 596, 598, 599, 684, 686, 688, 690, 692, 694, 696, 698 and 699 can be used in other board architectures without departing from the scope of the invention.

A beam steering computer 104 can be part of the transceiver or can be provided as a discrete component. Computer 104 can be embodied as a computer processing platform (e.g., a processor and memory) configured via software. Alternatively, hard wired circuitry, ASICS, programmable logic devices, software, and mixtures thereof can be used to embody computer 104. Computer 104 is separate from card 206 in one embodiment.

In one embodiment, beam steering computer 104 can be coupled via a control bus 105 to splitter/combiners 504, 506 and 508. Beam steering computer 104 can provide beam steering or time delay commands to control the time delay provided by time delay units 35 associated with splitter/combiners 504, 506 and 508.

Figure 3:
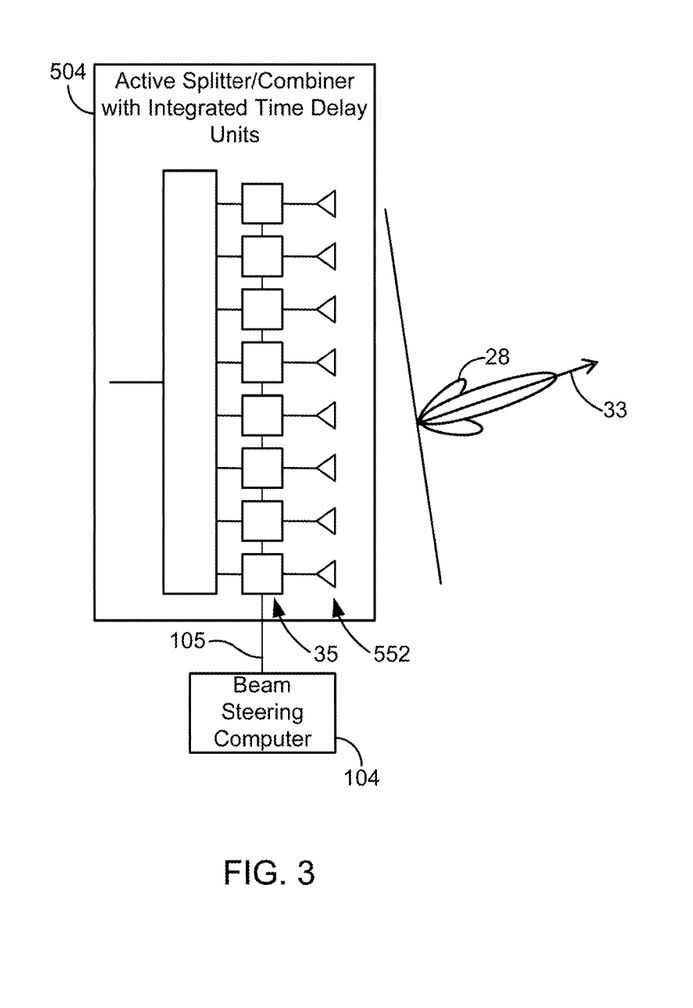
FIG. 3 is a schematic drawing of the antenna array illustrated in FIGS. 1 and 2 effecting a beam pointing angle for a beam in accordance with an exemplary embodiment.

With reference to FIG. 3, a beam 28 associated with antenna elements 552 is pointed at an angle by providing appropriate time delays via time delay units 35. Beam 28 can be scanned from 0 to 360 degrees (0 to 180 degrees or other range) in one or two dimensions by adjusting the time delay shift associated with time delay units 36 in one embodiment. In one embodiment, the time delay gradient across the aperture associated with antenna elements 20 moves beam 28 off of the perpendicular to pointing angle 33 which can be defined by angles $\Phi$ and $\theta$. In one embodiment, beam 28 can be steered vertically and in azimuth. Antenna elements 552 can be coupled directly or through amplifiers 32 (FIG. 1) to respective time delay units 35.

Figure 4:
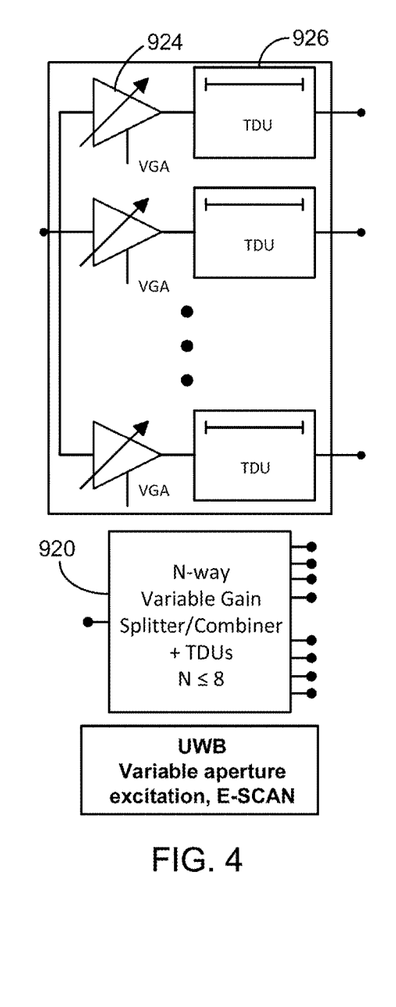
FIG. 4 is a schematic block diagram of a splitter/combiner including a time delay unit for use in the feed manifold illustrated in FIG. 1 in accordance with an exemplary embodiment.

With reference to FIG. 4, an active splitter/combiner 920 can include a set of variable gain amplifiers 924 and a set of integrated time delay units 926. In one embodiment, splitter/combiner 920 is for use in a system with ultra-wide band width, variable aperture excitation with electronic scanning Time delay units 926 can be used as time delay units 35 or 45 (FIG. 1).

In one embodiment, splitters/combiner 920 are active eight way splitters/combiners. In one embodiment, splitters/combiner 920 can be used as splitters/combiners 504, 506, 508, 404, 406, and 408, 584, 586, 588, 590, 592, 594, 596, 598, 599, 684, 686, 688, 690, 692, 694, 696, 698, and 699. Splitters/combiner 920 can be provided utilizing bi-polar silicon germanium, radio frequency complementary metal oxide semiconductor (RF CMOS), and indium phosphate semiconductor technologies and micro strip technologies.

Figure 5:
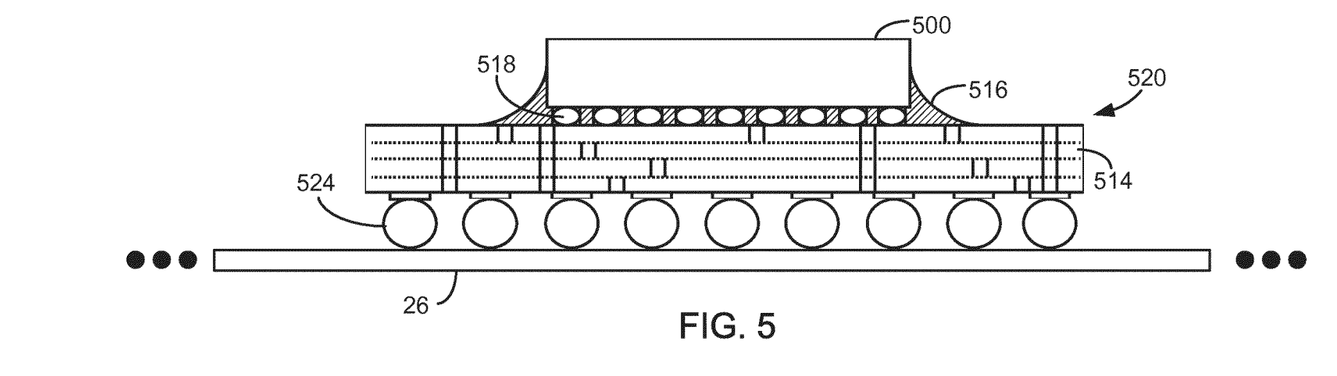
FIG. 5 is a cross sectional view schematic drawing of a card including a radio frequency integrated circuit with a time delay unit for the feed manifold illustrated in FIG. 1 in accordance with an exemplary embodiment.

With reference to FIG. 5, a radio frequency integrated circuit 500 associated with splitter/combiner 504 (FIG. 3) includes time delay unit 926 (FIG. 4). Radio frequency integrated circuit 500 is silicon germanium in one embodiment. Radio frequency integrated circuit 500 is provided on an interposer 514 which is coupled to card 206 via a ball grid array 524. Radio frequency integrated circuit 500 is coupled to interposer 514 by a ball grid array 518. Circuit 500 can be encapsulated and include an underfill 516. Interposer 514 includes transmission line (T-line) delay lines 520, which can be selectively utilized for incorporating the features associated with time delay units 926. Interposer 514 can be a multilayer rigid or flexible circuit board in one embodiment (e.g., polyimide, F4, ceramic, etc.).

Figure 6:
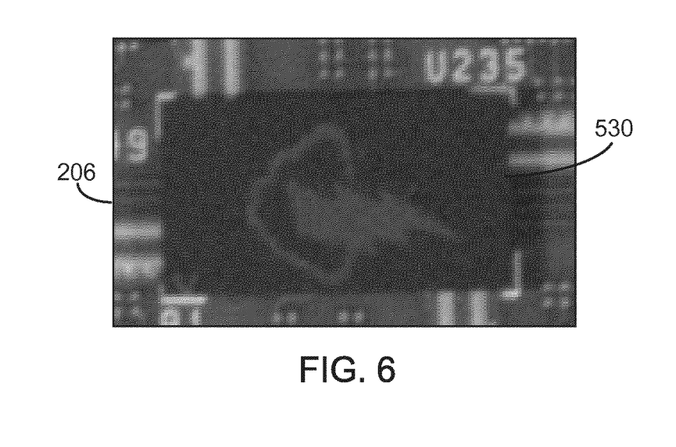
FIG. 6 is a top view schematic illustration of a portion of the card illustrated in FIG. 4 in accordance with another exemplary embodiment.

With reference to FIG. 6, card 206 includes a module 530. Module 530 can be a single encapsulated module 530 and can include interposer 514 and radio frequency integrated circuit 500 in one embodiment.

Figure 7:
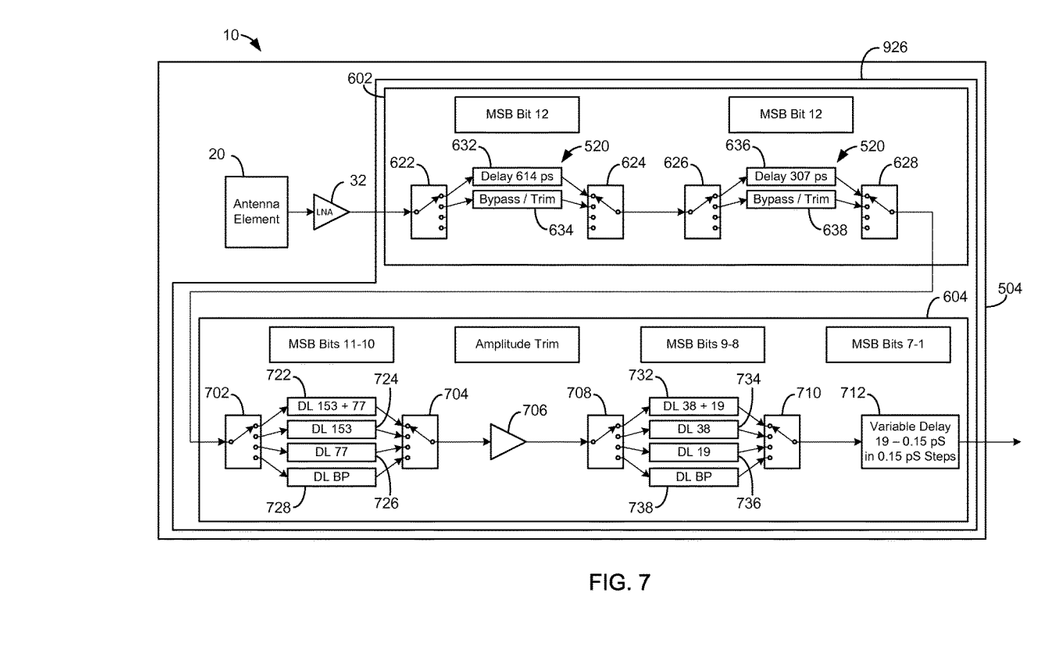
FIG. 7 is a general block diagram of the time delay unit illustrated in FIG. 4 in accordance with another exemplary embodiment.

With reference to FIG. 7, time delay unit 926 includes a radio frequency integrated circuit portion 604 provided on radio frequency integrated circuit 500 (FIG. 5) and an interposer portion 602 provided on interposer 514 (FIG. 5).

In one embodiment, small analog time delays are provided within circuit 500, and medium time delays are provided within circuit 500. In one embodiment, circuit 500 includes as large as possible time delays as dictated by size, cost and yield of circuit 500. In one embodiment, amplitude gain adjustment and channel trim within circuit 500 is used to compensate for amplitude variances due to the switched lines in the antenna array feed (e.g., motherboard), interposer 514, and one or more of circuits 500. In one embodiment, large time delays are provided on interposer 514, and very large time delays are provided within the antenna feed (e.g., the motherboard).

Unit 926 can selectively provide time delays from an approximately 0.1 to over 300 picoseconds (e.g., 921 picosecond) in one embodiment. In one embodiment, time delay paths are provided entirely on interposer 514 and radio frequency circuit 500 without requiring time delay paths on card 206. In one embodiment, additional paths on card 206 can be selectively engaged for longer time delays.

Time delays provided by time delay unit 926 on board 206 are controlled by a 13 bit time delay command or signal in one embodiment. The 13 bit time delay command can be a digital signal provided by beam steering computer 104 (FIG. 3).

Interposer portion 602 includes a radio frequency multiplexer 622, a radio frequency multiplexer 624, a radio frequency multiplexer 626 and a radio frequency multiplexer 628 in one embodiment. In one embodiment, multiplexers 622, 624, 626, and 628 can be four by one multiplexers or demultiplexers. Portion 602 also includes a 614 picosecond path 632, a bypass (e.g., 0 picosecond) path 634, a 307 picosecond path 636 and a bypass (e.g., 0 picosecond) path 638. Paths 632 and 636 are provided on multiple layers associated with interposer 514 in one embodiment. Paths 632 and 636 can be linear transmission paths.

Multiplexer 622 is controlled by a thirteenth (highest) most significant bit of the time delay command to selectively provide path 632 associated with a 614 picosecond delay or bypass path 634 in one embodiment. Similarly, multiplexers 626 and 628 select paths 636 or 638 in response to a twelfth most significant bit of the time delay command. Although only paths 632, 634, 636 and 638 are shown, additional paths can be provided in portion 602.

Radio frequency integrated circuit portion 604 includes a radio frequency multiplexer 702, a radio frequency multiplexer 704, a radio frequency variable gain amplifier 706, a radio frequency multiplexer 708, a radio frequency multiplexer 710, and variable delay circuit 712 in one embodiment. In addition, paths 722, 724, 726, and 728 are provided between multiplexers 702 and 704, and paths 732, 734, 736 and 738 are provided between multiplexers 708 and 710. Multiplexers 702, 704, 708, 710, and 712 can be four by one multiplexers or demultiplxers in one embodiment.

Path 722 provides a delay of 230 picoseconds, path 724 provides a delay of 153 picoseconds, path 726 provides a delay of 77 picoseconds and path 728 provides a bypass of 0 picoseconds in one embodiment. Path 732 provides a delay of 57 picoseconds, path 734 provides a delay of 38 picoseconds, path 736 provides a delay of 19 picoseconds and path 738 provides a delay of a bypass path or zero picosecond delay in one embodiment. In one embodiment, paths 634 and 638 is a relative reference for the delays and is normalized to zero.

The eleventh and tenth most significant bits 11 of the time delay command and the tenth most significant bits of the time delay command control multiplexer 702 and 704 to select one of paths 722, 724, 726, and 728. The ninth most significant bits of the time delay command and the eighth most significant bits of the time delay command control multiplexer 708 and 710 to select one of paths 732, 734, 736, or 738 in one embodiment. Paths 722, 724, 726, 732, 734, and 736 can be linear transmission lines in one embodiment. In one embodiment, multiplexers 702, 704, 708 and 710 select paths 722, 724, 726, 728, 732, 734, 736 and 738 to provide a 19 to 300 picosecond delay.

Variable delay circuit 732 can be an analog integrated circuit for providing continuously variable delay adjustments. Circuit 732 can utilize non-linear transmission paths (e.g., active devices) to provide a delay from 19 to 0.15 picoseconds in 0.15 picosecond delay increments in one embodiment. Circuit 732 can be controlled by the seventh to first (least) most significant bits of the time delay command in one embodiment.

Variable gain control circuit 706 can be integrated within radio frequency integrated circuit 500 and is controlled to make gain adjustments for losses associated with travel through paths 632, 634, 638, 646, 722, 724,726, 728, 732, 734, 736, 738 and circuit 712. Generally, longer delay lines provide greater loss which loss can be accommodated by providing the appropriate gain via amplifier 706. Beam steering computer 104 (FIG. 3) can provide a gain command or amplitude trim signal for amplifier 706.

Although shown on interposer portion 602, multiplexers 622, 624, 626 and 628 and multiplexers 702, 704, 706, 708, 710, amplifier 706, and variable delay circuit 712 can be provided in radio frequency integrated circuit 500. Connections between paths 632, 634, 638, and 640, or interposer 514 and multiplexers 622, 624, 626, and 628 can be provided through ball grid array 518 in one embodiment. In one embodiment, multiplexers 622, 624, 626 and 628 and multiplexers 702, 704, 706, 708, 710, amplifier 706, and variable delay circuit 712 can be provided on separate integrated circuits.

In one embodiment, the assembly for splitter/combiner 504 (FIG. 3) can have a length/width ratio compatible with required lattice spacing. Paths 634 and 638 can be planar transmission lines such as a multi-layer strip line, finite ground co-planer wave guide (FGCPWG) micro strips or Z-Fab™ miniature strip-line wave guide, trough wave guide or various transverse electromagnetic (TEM) transmission line structures in certain embodiments. In other embodiments, paths 632 and 634 can be via electric wave guide printed circuit board conductors, embedded optical wave guides or miniature transmission line square-ax lines. In one embodiment, time delays can be calibrated by measuring directly at the antenna and appropriate adjustments can be made.

Interposer 514 and radio frequency integrated circuit 500 can include microfluid cooling for high power jammer array applications in one embodiment. In one embodiment, one of interposer 514 and radio frequency integrated circuit 500 uses micro fluid cooling. In one embodiment, cards 26 and 28 (FIG. 1) use microfluid cooling.

In one embodiment, time delay unit 920 includes additional delay lines that can be embedded on card 206. By utilizing active splitters/combiners, additional space on card 206 can be utilized for larger delay lines in one embodiment. Radio frequency switches within radio frequency integrated circuit 500 can be utilized to select paths on card 206 in one embodiment.

Time delay units 920 can enable low side lobe level operation in real time pattern for synthesis for low side lobe levels and A/J null forming. In one embodiment, time delay unit 920 allows a more analog control of the time delay.

Although discussed with respect to various splitter/combiner sizes and array sizes, the splitter/combiner sizes and array sizes are not discussed in a limiting fashion. Large feed manifold for M×N two dimensional active electronically scanned array structures can be built with multiple active combiner integrated circuits connected through printed circuit board interconnects in one embodiment.

By miniaturizing the feed manifold system 10 using cards 206 and 208, multiple channels or beams can be achieved in one embodiment. Feed manifold system 10 with active devices replaces large, high isolation Wilkinson combiners and/or reactive-T passive splitters/combiners in one embodiment. In addition, the use of active splitters/combiners allows the use of amplifiers to provide variable gain to each channel to reduce radio frequency system losses and provide amplitude tapering for low side band future electronic scanning array design. In addition, the active circuitry allows integration of time delay units for one dimensional and two dimensional beam scanning. In one embodiment, the active circuitry can enable intermediate frequency based active electronically scanned array manifold. In one embodiment, mixer circuitry is integrated with the active combiners and splitters. In one embodiment, miniaturization enables parallel banks of feeds for use in analog beam forming. In one embodiment, system 10 has the capability to realize multiple independently steered UWB AESA beams using units 35 and 45 due to the ability to create multiple parallel analog beam formers (ABFs) using miniature active RFIC combiner/splitter technologies, as described in U.S. application Ser. No. 14/300,074, now U.S. Pat. No. 9,653,820, filed on an even date herewith by West et al., and entitled "Active Manifold System and Method for an Array Antenna".

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

What is claimed is:

1. An electronically steerable antenna system, comprising:
   a plurality of antenna elements; and
   a plurality of time delay units, each of the time delay units being associated with a respective antenna element of the antenna elements and comprising a plurality of multiplexers, wherein the time delay units comprise a radio frequency integrated circuit time delay unit portion having integrated time delay paths disposed on a radio frequency integrated circuit and an interposer time delay unit portion, the interposer time delay portion being provided on an interposer associated with the radio frequency integrated circuit and having interposer time delay paths disposed on the interposer, wherein the multiplexers select the integrated time delay paths and the interposer time delay paths for a time delay for the respective antenna element.

2. The system of claim 1, wherein the interposer time delay paths are provided on a planar transmission line.

3. The system of claim 2, wherein the planar transmission line is a multilayer switched strip line.

4. The system of claim 1, wherein at least one of the multiplexers is disposed in the radio frequency integrated circuit and are configured to select a circuit board time delay path on a printed circuit board associated with the respective antenna element and coupled to the interposer.

5. The system of claim 2, wherein the planar transmission line comprises a plurality of multilayer delay paths, the multilayer delay paths each having a different length.

6. The system of claim 5, wherein the radio frequency integrated circuit comprises an amplitude trim circuit disposed between the multiplexers.

7. The system of claim 5, wherein the multilayer delay paths provide delays of more than 300 picoseconds.

8. The system of claim 7, wherein the integrated time delay paths provide delays are in the range of 0-300 picoseconds.

9. A method of steering using an electronically scanned antenna array, the method comprising:
   using a first time delay unit at least partially disposed on a radio frequency integrated circuit associated with a first antenna element, the first time delay unit comprising a plurality of selectable first time delay paths to provide a first time delay for the first antenna element, wherein the first time delay paths are disposed within the radio frequency integrated circuit and on an interposer, the interposer being coupled between a printed circuit board associated with the first antenna element and the radio frequency integrated circuit; and using a second time delay unit at least partially disposed on a radio frequency integrated circuit associated with a second antennae element, the second time delay unit comprising a plurality of selectable second time delay paths to provide a second time delay for the second antenna element.

10. The method of claim 9, wherein a set of the selectable first time delay paths are selected via a set of multiplexers to provide the first time delay.

11. The method of claim 10, wherein the first time delay is between 0 and 300 picoseconds.

12. The method of claim 10 wherein the radio frequency integrated circuit associated with the first antenna element comprises multiplexers, the multiplexers comprising a first multiplexer and a second multiplexer and wherein the selectable first time delay paths comprise a first set of paths on the interposer and coupled to the first multiplexer and a second set of paths on the radio frequency integrated circuit coupled to the second multiplexer.

13. The method of claim 9, further comprising adjusting an amplitude of a signal in the first time delay unit.

14. The method of claim 12, further comprising receiving a first set of time delay commands and selecting the first time delay paths and the second time delay paths in response to the time delay commands.

15. The method of claim 14 wherein the time delay commands are digital data commands.

16. A time delay unit for an ultra-wide band antenna array system, the ultra-wide band antenna array system comprising a printed circuit board, a radio frequency integrated circuit and an interposer, the radio frequency integrated circuit being disposed on the interposer, the interposer being disposed on the printed circuit board, the time delay unit comprising:
   a radio frequency integrated circuit time delay unit portion comprising a plurality of first selectable delay paths disposed within the radio frequency integrated circuit; and
   an interposer time delay unit portion comprising a plurality of second selectable delay paths, the interposer time delay portion being provided on the interposer.

17. The time delay unit of claim 16, wherein the interposer time delay portion comprises an input coupled to a low noise amplifier and an output coupled to the radio frequency integrated circuit time delay portion, wherein the low noise amplifier is disposed on the radio frequency integrated circuit.

18. The time delay unit of claim 16, further comprising:
   an input for receiving a time delay command, wherein the first selectable delay paths and the second selectable delay paths are selected in accordance with the time delay command; and
   at least one third selectable delay path provided on the radio frequency integrated circuit.

19. The time delay unit of claim 16, further comprising a variable delay circuit on the radio frequency integrated circuit.

20. The time delay unit of claim 19, wherein the variable delay circuit provides delays from 0.1 to 19 picoseconds and the first selectable delay paths provide delays from 19 to 300 picoseconds.

* * * * *